United States Patent [19]

Ibok et al.

[11] Patent Number: 5,518,950

[45] Date of Patent: May 21, 1996

[54] SPIN-ON-GLASS FILLED TRENCH ISOLATION METHOD FOR SEMICONDUCTOR CIRCUITS

[75] Inventors: Effiong E. Ibok; John D. Williams, both of Austin, Tex.

[73] Assignee: Advanced Micro Devices, Inc., Sunnyvale, Calif.

[21] Appl. No.: 299,641

[22] Filed: Sep. 2, 1994

[51] Int. Cl.$^6$ .................................................. H01L 21/76
[52] U.S. Cl. .............................................. 437/67; 437/231
[58] Field of Search ............................. 437/67, 231, 248, 437/247; 148/DIG. 50, DIG. 85, DIG. 86, DIG. 118, DIG. 3

[56] References Cited

U.S. PATENT DOCUMENTS

| | | | |
|---|---|---|---|
| 4,222,792 | 9/1980 | Lever et al. | 437/67 |
| 4,994,405 | 2/1991 | Jayakar | 437/53 |
| 5,294,562 | 3/1994 | Lur et al. | 437/67 |
| 5,362,981 | 11/1994 | Sato et al. | 257/371 |

FOREIGN PATENT DOCUMENTS

| | | |
|---|---|---|
| 5221781 | 12/1975 | Japan. |
| 58-164238 | 9/1983 | Japan. |
| 59-208744 | 11/1984 | Japan. |
| 60-157235 | 8/1985 | Japan. |
| 2106645 | 11/1985 | Japan. |
| 3234041 | 10/1991 | Japan. |

*Primary Examiner*—George Fourson
*Attorney, Agent, or Firm*—Foley & Lardner

[57] ABSTRACT

A method of field isolation of a semiconductor circuit includes forming a silicon oxide layer over the surface of a substrate, depositing a layer of silicon nitride overlying said silicon oxide layer, patterning said silicon oxide and silicon nitride layers to provide openings and exposing portions of said substrate, forming trench regions in said openings, forming a spin-on-glass (SOG) layer over said silicon nitride layer and in said trench regions, curing and annealing at a first temperature the SOG layer after it is formed, oxidizing the SOG layer at a second temperature, wherein the second temperature is less than first temperature, and patterning the oxidized SOG layer to expose the oxidized SOG layer formed in the trench regions.

27 Claims, 7 Drawing Sheets

S-D MASK (NEGATIVE RESIST)

OXIDE ETCH RESIST STRIP

BARRIER OXIDATION NITRIDE DEP S-D MASK

S-D ETCH (AND TRENCH ETCH)

RESIST STRIP SOG-COAT STEAM OX

S-D MASK (NEGATIVE RESIST)

OXIDE ETCH RESIST STRIP

NITRIDE STRIP

FIG. 11
{
SOG-FILLED TRENCH ISOLATION PROCESS FLOW

BARRIER OXIDE
\*NITRIDE DEPOSITION
S-D MASK
S-D ETCH (AND TRENCH)
Vt ADJUSTMENT IMPLANTS (SEE SAMPLE RUNCARD)
+SOG SPIN (TO DESIRED FIELD THICKNESS ON TEST WAFER; OR SOG COAT+CVD
    OXIDE DEP OR CVD OXIDE DEP+SOG COAT+CVD OXIDE DEP)
+STEAM OXIDATION (SEE TABLE 2 FOR PROCESS)
+S-D MASK (NEGATIVE RESIST)
+OXIDE ETCH/RESIST STRIP
NITRIDE STRIP

\* NITRIDE DEP IS INCLUDED TO OBVIATE THE NEED FOR A LONG 10:1HF DIP
AFTER THE SOG THERMALIZATION. IT IS ALSO INCLUDED TO PROTECT THE
SILICON DURING PLASMA OXIDE ETCH.
}

FIG. 12

| SOG THERMALIZATION OXIDATION PROCESS | | | | | |
|---|---|---|---|---|---|
| STEP | TIME [MIN] | TEMP [C] | N2 [SLM] | O2 [SLM] | H2 |
| IDLE | -- | 750 | 15.0 | 1.5 | |
| PUSH | 11 | 750 | 15 | 1.5 | |
| RAMP UP | 25 | 1000 | 15 | 1.5 | |
| ANNEAL | 10 | 1000 | 15 | 1.5 | |
| RAMP | 30 | 900 | 15 | 1.5 | |
| OXIDIZE | 30 | 900 | | 4 | 7.0 |
| RAMP DOWN | 40 | 750 | 15 | 1.5 | |
| PULL | 11 | 750 | 15 | 1.5 | |
| IDLE | -- | 750 | | | |

SPIN-ON-GLASS FILLED TRENCH ISOLATION METHOD FOR SEMICONDUCTOR CIRCUITS

BACKGROUND OF THE INVENTION

1. Field of the Invention

The present invention relates generally to semiconductor circuit processing, and more specifically to a method of field isolation using spin-on-glass (SOG) polymers.

2. Description of the Related Art

Local oxidization of silicon (LOCOS) is the conventional lateral isolation scheme. Referring to FIG. 1, in the LOCOS technique, a layer of silicon nitride 14 is deposited over a barrier oxide 12 overlying a silicon substrate 10. The barrier oxide 12 is a thin oxide which allows better adhesion between the nitride and silicon and acts as a stress relaxation layer during field oxidation. The nitride and oxide layers 14, 12 are etched to leave openings 11 exposing portions of the silicon substrate where the local oxidation will take place. A boron channel-stop layer is ion implanted into the isolation regions. The field oxide 15 is grown within the openings 11 and the nitride and barrier oxide layers 14, 12 are removed. This completes the local oxidation.

When the silicon nitride openings 11 between active device regions are reduced to the sub-micrometer regime, a reduction in field oxide thickness within the openings is observed. This oxide thinning in the area where field spacing is narrow causes insufficient isolation between active regions 13. Thus, the scaling capability of the LOCOS technique is severely restricted by lateral encroachment of the oxide (often referred to as bird's beak) into the active region 13. As shown in FIG. 1, in LOCOS isolation, scalability is limited by oxide encroachment under the nitride during field oxidation. As this encroachment can typically be as high as 80 percent of the field oxide thickness [Lbb/Tfox= 0.8], at spacings of 1.0 um, and a field oxide thickness of 5000 A, the bird's beak encroachment may be as high as 0.8 um, leaving only 0.2 um of active region 13.

Several enhancements to conventional LOCOS involve either additional mask levels and complex processing sequences or employ processes, such as lift-off, whose control and reliability are questionable.

One such technique is known as Side Wall Masked Isolation (SWAMI) described by K. Y. Chiu et al in IEDM Tech. Digest, pp 224–227, December 1982 and in IEEE Trans. Electron Devices, vol. ED-29, pp 536–540, 1982. In this technique, the silicon substrate is trenched before the oxidation step and thus stress, which often leads to defects in the silicon substrate, is a problem.

Another such technique is known as poly-buffered LOCOS which is described by R. L. Guldi et al. in J. Electrochem. Soc., 136, 3815, 1989; N. Hoshi et al., Proceedings of IEDM Meeting, p. 300, December 1986; and R. A. Chapman et al., Proceedings of IEDM Meeting, p. 362, December 1987. In this technique, in addition to the complexity of process steps, the danger exists of a double bird's beak if the polysilicon is allowed to be oxidized before the nitride deposition.

Yet another known technique uses a spin-on-glass polymer. A spin-on-glass (SOG) composition is a liquid, silica-based composition that can be applied to the surface of a semiconductor wafer and spun with the wafer to provide a coating with a level top surface. As reported by G. Smolinsky, et al. in J. Electrochem. Soc., 137, 229, 1990, in this technique, SOG is filled in the trenches formed in the substrate, two different masks are used to accommodate large field areas and the SOG is annealed in nitrogen and dry oxygen for 30 minutes at 900° C. SOG is unstable and with this technique, the properties of the SOG are altered only slightly without approaching the properties of a thermal oxide, as reported by M. P. Woo, J. L. Cain and C. O. Lee in J. Electrochem. Soc, 137, 196 (1990) and by E. E. Ibok and S. Garg in Abstract No. 862, Proceedings of the 183rd Meeting of the Electrochem. Soc., Honolulu, Hi. (1993). Moreover, the different thermal expansion of the spin-on-glass and the underlying substrate contributes to the cracking of the spin-on-glass, thereby yielding poor reliability.

Furthermore, when wide isolation fields are required, a dip is formed in the spin-on-glass surface and the spin-on-glass does not retain a planar shape. A known solution is to fill up the isolation trenches with multiple spins. However, the additional spin-on-glass spins also add the spin-on-glass polymer on the active regions of the substrate, thereby requiring additional processing to remove the spin-on-glass polymer from the active regions. This additional processing is expensive and thus undesirable.

SUMMARY OF THE INVENTION

It is therefore an object of the invention to provide a method for effective isolation of active regions without any reduction in the size of the active regions on the semiconductor substrate.

It is another object of the invention to provide a method for isolation of active regions which requires a minimum number of process steps.

Another object of the invention is to provide a method of forming an isolation structure which can be used in the fabrication of VLSI (Very Large Scale Integration) devices.

It is a further object of the invention to provide such a method which can be used for both wide and narrow isolation locations.

Yet another object is to provide such a method which provides negligible bird's beak encroachment in the active region of the semiconductor device.

Still another object of the invention is to provide an isolation method which uses spin-on-glass in the field region reliably by preventing any cracking in the spin-on-glass.

In accordance with the object of this invention, a method of field isolation using spin-on-glass is achieved. A silicon oxide layer is formed over the surface of silicon substrate. A layer of silicon nitride is deposited overlying the silicon oxide layer. The silicon oxide and silicon nitride layers are patterned to provide openings, exposing portions of the silicon substrate to be trenched. Trench regions are formed in the openings and the trenches are filled with spin-on-glass. The spin-on-glass is cured and annealed at a temperature which is higher than the oxidizing temperature of the spin-on-glass polymer, thereby ensuring a maximum shrinkage in the spin-on-glass and preventing the spin-on-glass from cracking. The spin-on-glass is then oxidized at the oxidizing temperature. The structure is masked with a source-drain mask with negative imaging to expose the active regions. The oxidized spin-on-glass covering the nitride and the nitride are etched off leaving the field regions.

Other objects and advantages of the invention will be apparent to those of ordinary skill in the art having reference to the following specification together with the drawings.

BRIEF DESCRIPTION OF THE DRAWINGS

In the accompanying drawings forming a material part of this description, there is shown:

FIG. 11 shows the sequence of steps in the fabrication process of the spin-on-glass isolation structure in the preferred embodiment of the present invention.

FIG. 12 shows the oxidation process steps according to the method of the present invention.

DESCRIPTION OF THE PREFERRED EMBODIMENTS

The process, steps and structures described below do not form a complete process flow for manufacturing semiconductor circuits. The present invention can be practiced in conjunction with semiconductor circuit fabrication techniques currently used in the art and known to those of ordinary skill, and only so much of the commonly practiced process steps are included as are necessary for an understanding of the present invention. The figures representing cross-sections of portions of a semiconductor circuit during fabrication are not drawn to scale, but instead are drawn so as to illustrate the important features of the invention.

Figure 2:
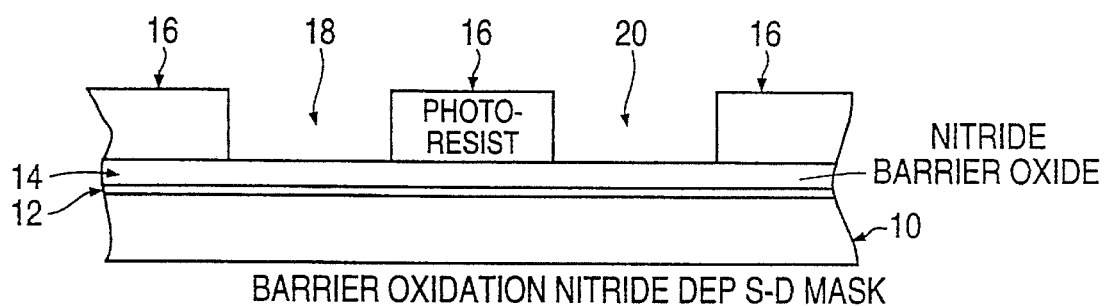
FIGS. 2–7 which schematically illustrate in cross-sectional representation, the preferred embodiment of the present invention.
Figure 7:
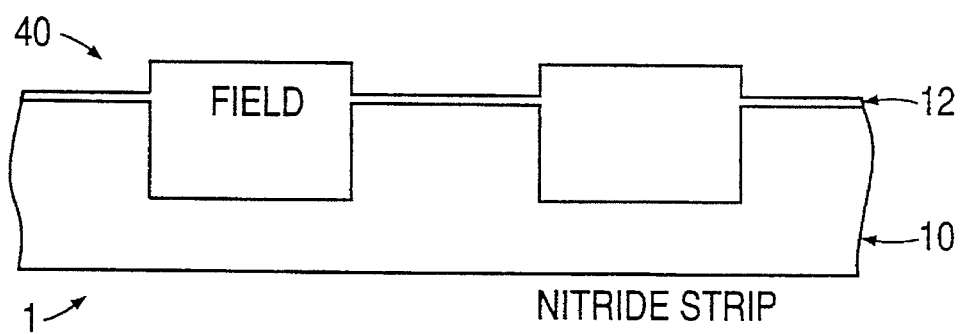

FIG. 11 outlines the sequence of steps in the fabrication process to form the spin-on-glass isolation structure 1 (See FIG. 7). Details of the steps according to the invention are described with particularity herein. Referring more particularly to FIG. 2, there is shown a monocrystalline silicon substrate 10. A layer 12 of silicon oxide is grown on the surface of the substrate to a preferred thickness of at least 100 angstroms. A layer of silicon nitride 14 is deposited over layer 12. A photoresist layer 16 (source-drain mask) is then formed over the silicon nitride layer 14 and patterned using conventional lithography and etching techniques to provide openings 18 and 20.

Figure 3:
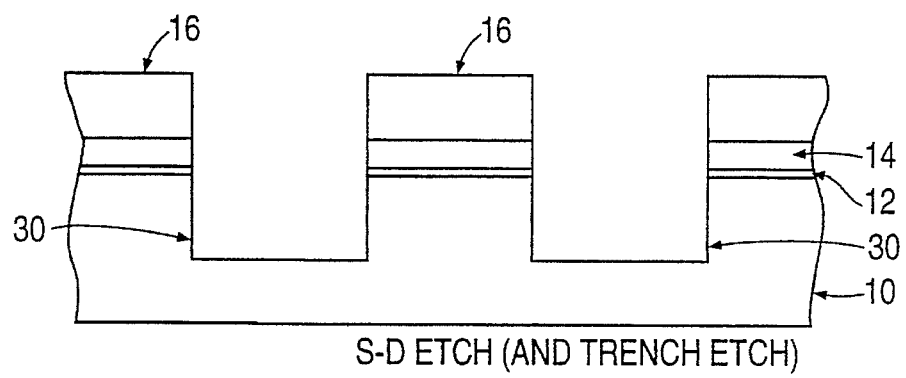

Referring now to FIG. 3, trenches 30 are formed in substrate 10 through the openings 18 and 20. Preferably, trenches 30, which are 0.5 to 10 micrometers wide and up to approximately 0.5 micrometers deep are formed using a conventional process.

Figure 4:
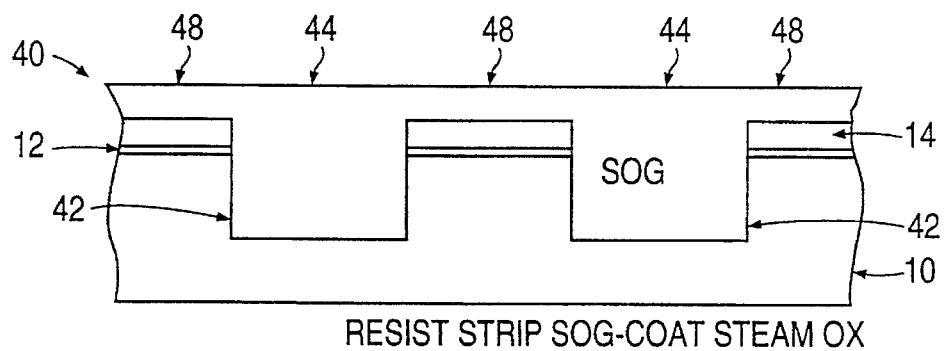

Referring now to FIG. 4, the photoresist layer 16 is removed. A spin-on-glass polymer is filled into the trenches 30 and applied on top of the nitride layer 14 forming a spin-on-glass layer 40. Trenches 30 are filled with multiple, successive applications of the spin-on-glass polymer. As shown in FIG. 4, spin-on-glass layer 40 comprises portions 42 which designate the spin-on-glass polymer in the trenches 30; portions 44 which designate the spin-on-glass polymer applied over portions 42; and portions 48 which designate the spin-on-glass polymer applied on the silicon nitride layer 14. The spin-on-glass polymer is preferably a siloxane-based polymer. A silicate-based polymer may also be used.

Next, the spin-on-glass layer 40 is cured and annealed in an environment of about 10% oxygen by volume to a high temperature up to approximately 1,000 degrees centigrade. This temperature is equal to the maximum post oxidation temperature which the substrate 10 would be exposed to. The curing and annealing ensure that the spin-on-glass layer 40 is subject to a maximum shrinkage for subsequent thermal cycles in further processing of the semiconductor substrate for eliminating cracks in the spin-on-glass layer 40. Because spin-on-glass layer 40 shrinks during the high-temperature anneal, it does not introduce any crystalline defects in the trenches. The spin-on-glass layer 40 is then oxidized in an environment containing steam and at a temperature which is less than the curing and annealing temperature, for example, about 900 degrees centigrade. Preferably, the oxidation time is about 15 minutes. FIG. 12 shows the oxidation process steps. After the oxidization step, the spin-on-glass layer 40 has properties analogous to that of a thermally grown oxide on silicon.

Figure 5:
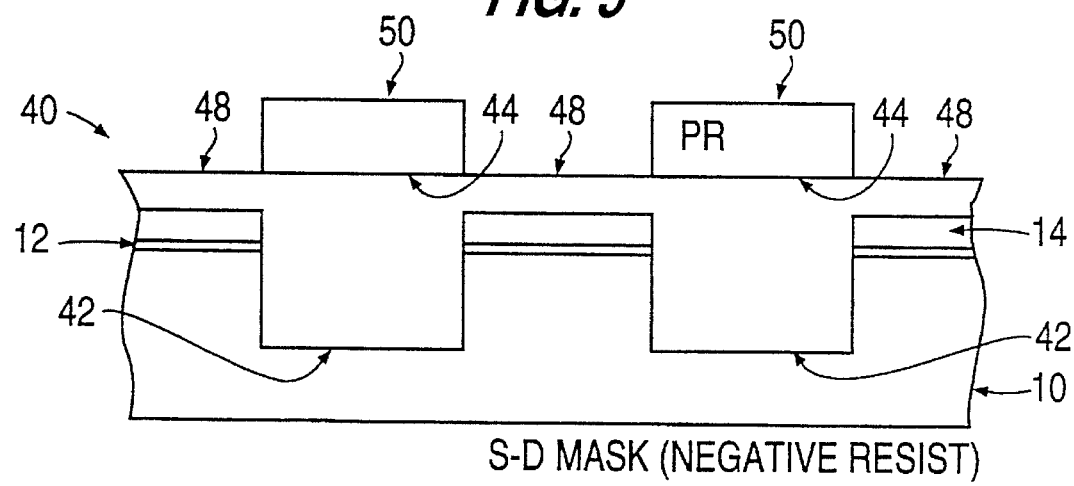

Referring to FIG. 5, a photoresist layer 50 (negative resist, source-drain mask) is formed over portions 44 according to conventional processes to expose portions 48.

Figure 6:
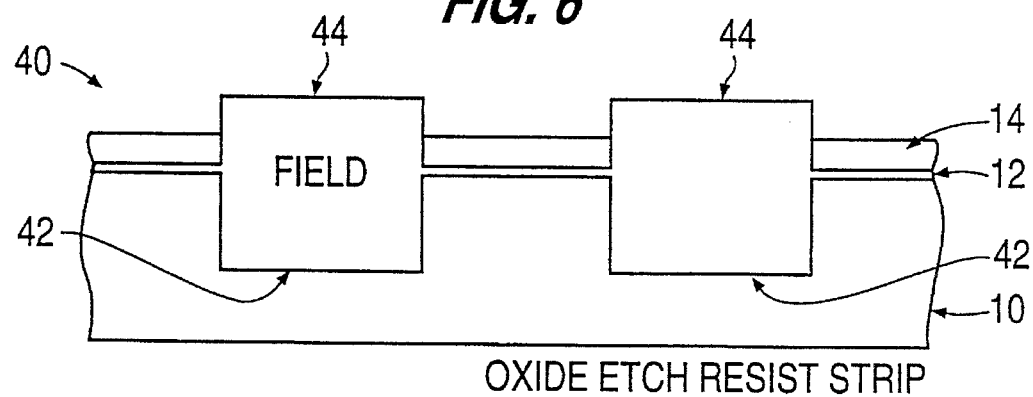

In FIG. 6, portions 48 of FIG. 5 have been etched and the photoresist layer 50 removed using conventional techniques. The negative resist portions 48 are removed without the need for separate process steps. The silicon nitride layer 14 is also etched away using conventional methods. This process results in the final field oxidation structure 1, illustrated in FIG. 7.

Figure 8:
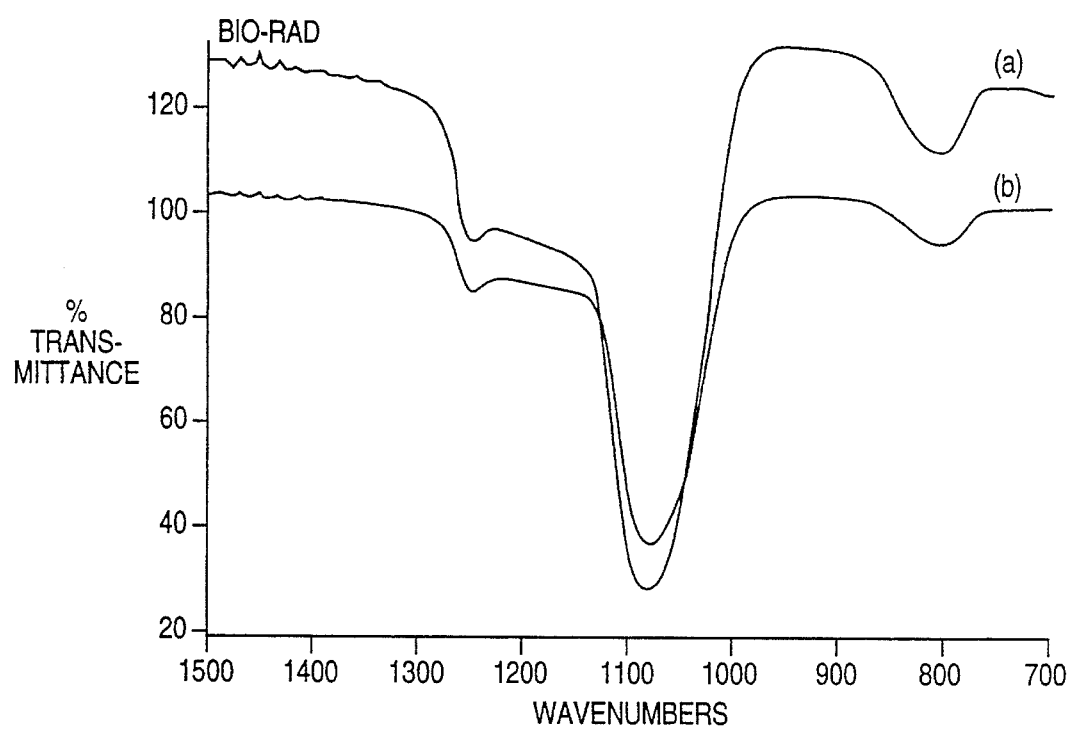
FIG. 8 which compares the fourier transform infrared (FTIR) spectra for a silicon oxide with a cured and annealed spin-on-glass.

Referring now to FIG. 8, the FTIR spectra of both a thermal oxide and the spin-on-glass layer 40 (FIG. 4) are shown. The FTIR spectra of both the thermal oxide (curve (a)) and layer 40 (curve (b)) appear to be equivalent for the peak characteristics of $SiO_2$ (seen at 810, 1080 and a shoulder at 1250 $cm^{-1}$) and appear at virtually the same wave number. More particularly, a comparison of curves (a) and (b) shows that the 1250 $cm^{-1}$ peak appeared at 1250.58 $cm^{-1}$ for the thermal oxide and at 1250.23 $cm^{-1}$ for layer 40. The 1080 $cm^{-1}$ peak appeared at 1082.96 $cm^{-1}$ for the thermal oxide and at 1081.1 $cm^{-1}$ for layer 40. The 810 $cm^{-1}$ peak appeared at 809.7 $cm^{-1}$ for the thermal oxide and at 810.6 $cm^{-1}$ for layer 40. For layer 40, the Si—$CH_3$ peak generally observed at 1275 $cm^{-1}$ was absent and the main Si—O peak at 1080 $cm^{-1}$ had shifted from 1040 $cm^{-1}$. Moreover, the etch rates of both films were found to be comparable—approximately 300 Å/min for the thermal oxide and 350 Å/min for the thermalized layer 40. The above data indicate virtually complete conversion of layer 40 to a film equivalent to thermal oxide.

Figure 9:
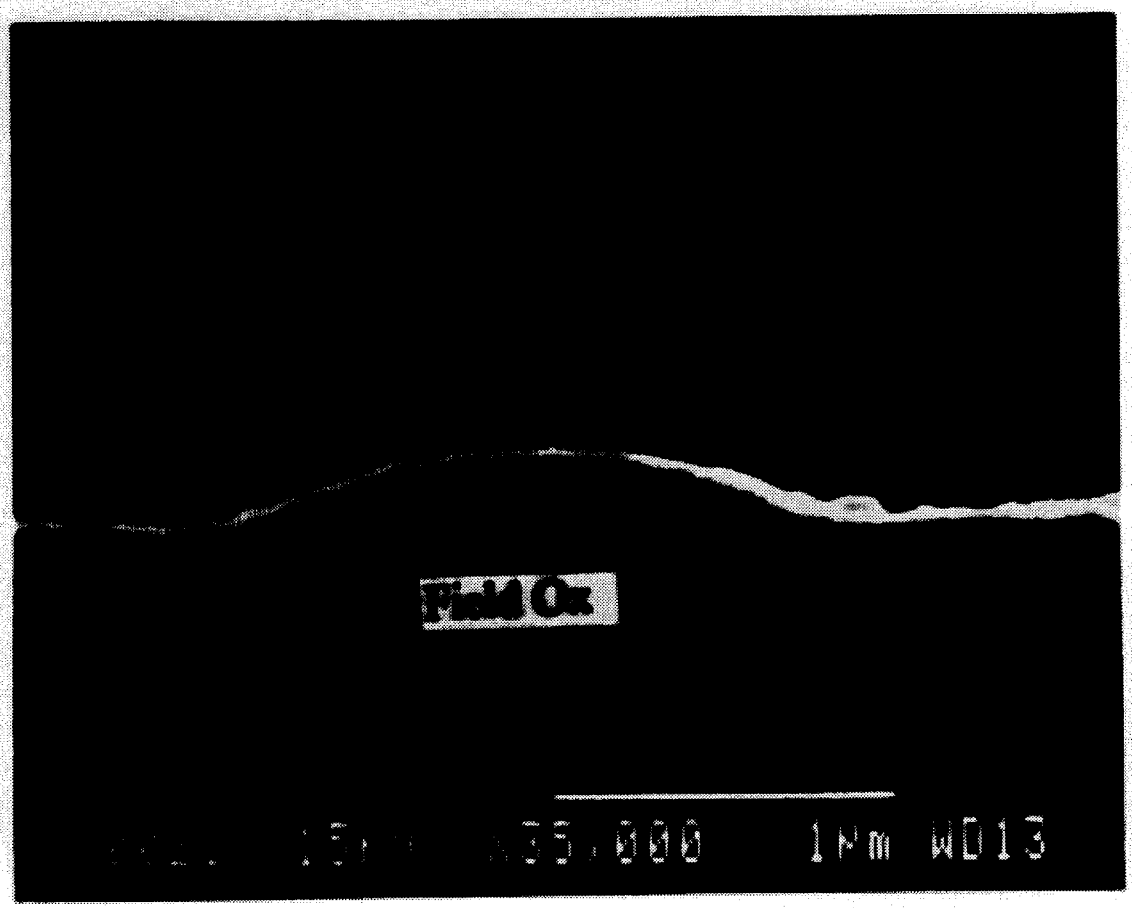
FIG. 9 which shows a cross-sectional representation of a SEM photograph showing the presence of bird's beak encroachment according to the conventional LOCOS technique.
Figure 10:
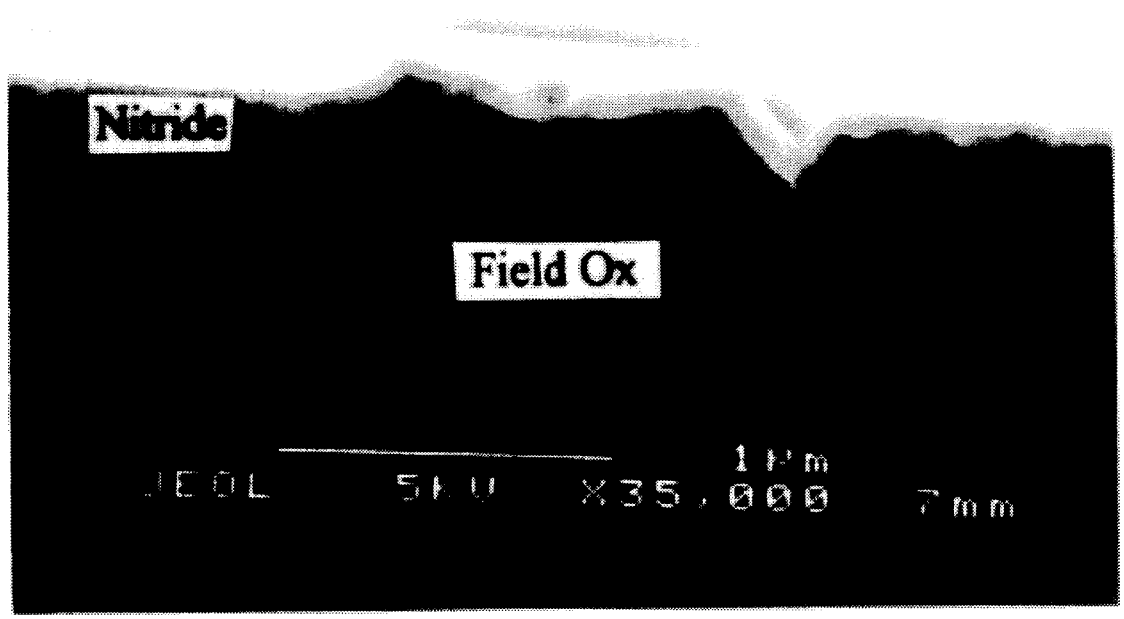
FIG. 10 which shows a cross-sectional representation of a SEM photograph showing the absence of bird's beak encroachment according to the method of the present invention.

FIGS. 9 and 10 show SEM micrographs of field oxide regions of a typical memory device fabricated according to the conventional LOCOS and the isolation structure 1 formed according to the present invention, respectively, immediately after field oxidation.

Figure 1:
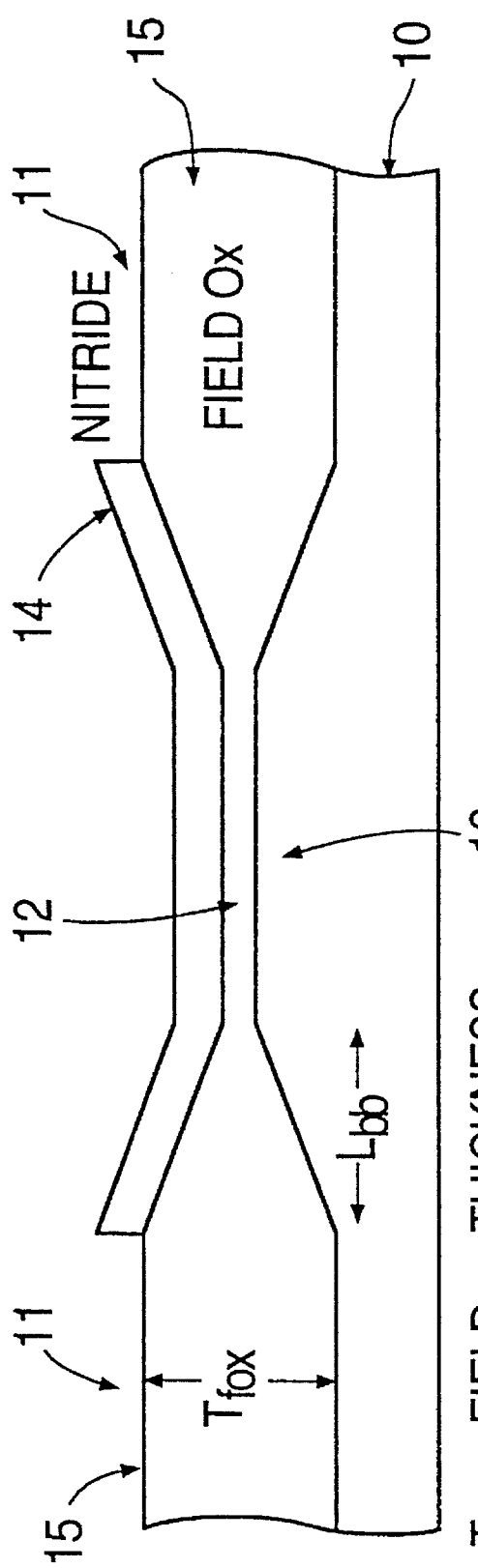
FIG. 1 which illustrates a cross-sectional representation of a conventional LOCOS isolation technique.

Referring to FIG. 9, a SEM photograph is shown showing the bird's beak encroachment in the isolation structure formed using a conventional LOCOS technique (FIG. 1). The field oxide thickness is approximately 4000 Å and the bird's beak length is approximately 3000 Å. The SEM photograph in FIG. 10 shows a negligible bird's beak encroachment which results when employing a method according to the invention. The field oxide thickness is approximately 5000 Å and the bird's beak length is negligible. In FIG. 9, the barrier nitride has been etched off. The film covering the wafer surface is a nitride film provided to obtain a contrast and outline the field region during SEM.

The nitride layer is not part of the device structure. In FIG. 10, the nitride layer 14, has not been etched off.

With the present invention, the semiconductor circuit layout density is maximized by allowing n and p devices to butt against the trenches and good surface planarity is obtained.

While the invention has been particularly shown and described as reference to the preferred embodiment thereof, it will be understood by those skilled in the art that various changes in the form and details may be made without departing from the spirit and scope of the invention. For example, an oxide layer deposited by chemical vapor deposition may be placed under the spin-on-glass layer 40 or the spin-on-glass layer 40 may be encapsulated with top and bottom oxide layers.

What is claimed is:

1. A method of field isolation of a semiconductor circuit, the method comprising the steps of:
   a) forming a silicon oxide layer over the surface of a substrate;
   b) depositing a layer of silicon nitride overlying said silicon oxide layer;
   c) patterning said silicon oxide and silicon nitride layers to provide openings exposing portions of said substrate;
   d) forming trench regions in said openings;
   e) forming a spin-on-glass (SOG) layer over said silicon nitride layer and in said trench regions;
   f) heating said SOG layer at a temperature of about 1,000° C. in an environment of 10% oxygen by volume to form a cured and annealed SOG layer;
   g) heating said cured and annealed SOG layer at a temperature of about 900° C. in an environment of steam to form an oxidized SOG layer having an etch rate of less than about 350 Å/minute in a 10 parts by volume of water and 1 part by volume of hydrofluoric acid etchant at a temperature of about 25° C.; and
   h) patterning said oxidized SOG layer to expose the oxidized SOG layer formed in the trench regions.

2. The method in claim 1, wherein step h) comprises the steps of:
   masking portions of said spin-on-glass layer over said trench regions with negative imaging to expose portions of said spin-on-glass layer covering active regions of the semiconductor circuit;
   removing said portions of said spin-on-glass layer covering said active regions; and
   stripping said silicon nitride layer.

3. The method of claim 1, wherein said substrate comprises monocrystalline silicon.

4. The method of claim 1, wherein the trench regions have a depth of up to approximately 0.5 micrometers.

5. The method of claim 1, wherein said step f) is carried out in an environment of about 10% oxygen by volume.

6. The method in claim 1, wherein step g) is carried out in an environment of steam.

7. The method in claim 1, further comprising the step of depositing, by a chemical vapor deposition process, a first oxide layer in said trench regions, before said step e).

8. The method in claim 7, further comprising the step of, depositing by a chemical vapor deposition process, a second oxide layer on said oxidized SOG layer, after said step h).

9. The method in claim 1, wherein the silicon oxide layer has a thickness of at least 100 angstroms.

10. The method in claim 1, wherein said trench regions have a width in the range of about 0.5 to 10 micrometers.

11. The method in claim 1, wherein in step g) said SOG layer is oxidized for about 15 minutes.

12. The method in claim 1, wherein said spin-on-glass layer includes a siloxane polymer.

13. The method in claim 1, wherein the spin-on-glass layer includes a silicate polymer.

14. A spin-on-glass-filled trench isolation method, the method comprising the steps of:
   a) forming a silicon oxide layer over the surface of a substrate;
   b) depositing a layer of silicon nitride overlying said silicon oxide layer;
   c) forming and patterning a photoresist layer over said silicon nitride layer;
   d) etching said silicon nitride layer and said silicon oxide layer to form openings exposing portions of said substrate;
   e) forming trench regions in said openings;
   f) removing said photoresist layer;
   g) filling said trench regions with spin-on-glass to form a spin-on-glass layer in said trenches and over said silicon nitride layer;
   h) heating said spin-on-glass layer at a temperature of about 1,000° C. in an environment of 10% oxygen by volume to form a cured and annealed spin-on-glass layer;
   i) heating said cured and annealed spin-on-glass layer at a temperature of about 900° C. in an environment of steam to form an oxidized spin-on-glass layer having an etch rate of less than about 350 Å/minute in a 10 parts by volume of water and 1 part by volume of hydrofluoric acid etchant at a temperature of about 25° C.;
   j) selectively forming and patterning a negative photoresist layer on said oxidized spin-on-glass layer over said trench regions;
   k) etching said oxidized spin-on-glass layer in regions other than said trench regions;
   l) removing said negative photoresist layer; and
   m) removing said silicon nitride layer.

15. The method of claim 14, wherein said substrate comprises monocrystalline silicon.

16. The method of claim 14, wherein the trench regions have a depth of up to approximately 0.5 micrometers.

17. The method of claim 14, wherein said step h) is carried out in an environment of about 10% oxygen by volume.

18. The method in claim 14, wherein step i) is carried out in an environment containing steam.

19. The method in claim 15, further comprising the step of, depositing by a chemical vapor deposition process, a second oxide layer on said oxidized spin-on-glass layer, after said step m).

20. The method in claim 14, wherein the silicon oxide layer has a thickness of at least 100 angstroms.

21. The method of claim 14, wherein said trench regions have a width in the range of about 0.5 to 10 micrometers.

22. The method in claim 14, wherein in step i) said spin-on-glass layer is oxidized for about 15 minutes.

23. The method in claim 14, wherein said spin-on-glass polymer is a siloxane polymer.

24. The method in claim 14, wherein said spin-on glass polymer is a silicate polymer.

25. The method of claim 1, wherein said oxidized SOG layer has an etch rate approximately the same as that of a thermally grown oxide on silicon.

26. The method of claim 14, wherein said oxidized spin-on-glass layer has an etch rate approximately the same as that of a thermally grown oxide on silicon.

27. A spin-on-glass-filled trench isolation method, the method comprising the steps of:

a) forming a silicon oxide layer over the surface of a substrate;

b) depositing a layer of silicon nitride overlying said silicon oxide layer;

c) forming and patterning a photoresist layer over said silicon nitride layer;

d) etching said silicon nitride layer and said silicon oxide layer to form openings exposing portions of said substrate;

e) forming trench regions in said openings;

f) removing said photoresist layer;

g) depositing by a chemical vapor deposition process, a first oxide layer in said trench regions;

h) filling said trench regions with spin-on-glass to form a spin-on-glass layer in said trenches and over said silicon nitride layer;

i) heating said spin-on-glass layer at a temperature of about 1,000° C. in an environment of 10% oxygen by volume to form a cured and annealed spin-on-glass layer;

j) heating said cured and annealed spin-on-glass layer at a temperature of about 900° C. in an environment of steam to form an oxidized spin-on-glass layer having an etch rate of less than about 350 Å/minute in a 10 parts by volume of water and 1 part by volume of hydrofluoric acid etchant at a temperature of about 25° C.;

k) selectively forming and patterning a negative photoresist layer on said oxidized spin-on-glass layer over said trench regions;

l) etching said oxidized spin-on-glass layer in regions other than said trench regions;

m) removing said negative photoresist layer; and n) removing said silicon nitride layer.

* * * * *